United States Patent [19]

Early

[11] Patent Number: 4,833,521
[45] Date of Patent: May 23, 1989

[54] MEANS FOR REDUCING SIGNAL PROPAGATION LOSSES IN VERY LARGE SCALE INTEGRATED CIRCUITS

[75] Inventor: James M. Early, Palo Alto, Calif.

[73] Assignee: Fairchild Camera & Instrument Corp., Cupertino, Calif.

[21] Appl. No.: 218,433

[22] Filed: Jul. 8, 1988

Related U.S. Application Data

[63] Continuation of Ser. No. 117,454, Nov. 2, 1987, which is a continuation of Ser. No. 894,452, Aug. 4, 1986, which is a continuation of Ser. No. 561,017, Dec. 13, 1983.

[51] Int. Cl.$^4$ .................. H01L 23/48; H01L 29/46; H01L 29/04; H01L 29/40
[52] U.S. Cl. .................................... 357/68; 357/71; 357/59; 357/53; 357/54; 357/84
[58] Field of Search .................. 357/71, 68, 59 J, 53, 357/54, 84; 333/247

[56] References Cited

U.S. PATENT DOCUMENTS

| | | | |
|---|---|---|---|
| 3,257,588 | 6/1966 | Mueller | 357/84 |
| 3,431,468 | 3/1969 | Huffman | 357/84 |
| 3,518,494 | 6/1970 | James | 357/53 |
| 3,715,631 | 2/1973 | Beneking | 357/53 |
| 3,811,076 | 5/1974 | Smith, Jr. | 357/53 |
| 4,021,838 | 5/1977 | Warwick | 357/68 |
| 4,067,099 | 1/1978 | Ito et al. | 29/571 |
| 4,197,554 | 4/1980 | Meusburger et al. | 357/51 |
| 4,475,118 | 10/1984 | Klein et al. | 357/59 |

FOREIGN PATENT DOCUMENTS 0079775 5/1983 European Pat. Off. .
3446614 7/1985 Fed. Rep. of Germany .

Primary Examiner—Andrew J. James
Assistant Examiner—Robert P. Limanek
Attorney, Agent, or Firm—Skjerven, Morrill, MacPherson, Franklin & Friel

[57] ABSTRACT

A method and means for reducing signal propagation losses in very large scale integrated circuits is provided comprising a ground plane located adjacent to, but insulated from, a conductive signal layer overlying an active region in a semiconductor substrate. While, the ground plane is preferably disposed between the signal layer and the substrate, it may be disposed above the signal layer. Moreover, two or more signal layers may be employed and sandwiched between a pair of ground planes.

9 Claims, 4 Drawing Sheets

MEANS FOR REDUCING SIGNAL PROPAGATION LOSSES IN VERY LARGE SCALE INTEGRATED CIRCUITS

This application is a continuation application Ser. No. 07/117,454, filed 11/2/87 which is a continuation of 06/894,452 filed 08/04/86 which is a continuation of 06/561,017 filed 12/13/83.

BACKGROUND OF THE INVENTION

1. Field of the Invention

This invention relates to semiconductor devices and more particularly to very large scale integrated circuits operating at high speed.

2. Description of the Prior Art

Integrated circuits are well known. Within recent years, much interest has been exhibited in providing integrated circuits utilizing very large scale integration (i.e. "VLSI"). Such circuits contain a very large number of semiconductor devices, usually over 10,000, having at least 1 device per square mil. It is also quite desirable and sometimes essential to provide a VLSI circuit which is capable of operating at extremely high frequencies (e.g. above 1 gigahertz) or very high pulse rates (e.g. above 1 gigabit per second).

The following disclosure is directed to integrated circuits constructed in silicon semiconductor material. However, it will be apparent to those of ordinary skill in the art that the disclosed concepts are equally applicable to integrated circuits constructed in materials other than silicon.

Referring to the enclosed drawings, a cross-sectional view of a typical packaged prior art integrated circuit 10 is shown in FIG. 1a. The integrated circuit structure 10 comprises a semiconductor substrate 12 which is physically and electrically mounted on lead frame 11. Lead frame 11 is part of a package such as, for example, a Dual-In-Line (DIP) package. Typically lead frame 11 is fabricated of Kovar or Alloy 42, or other suitable conductive material. On the top surface of substrate 12 is formed an active region 13 containing active devices (not shown), including transistors, diodes, and logic gates. An insulating layer 14, typically comprising silicon dioxide, is formed on the surface of active region 13. Located above active region 13 and spaced apart therefrom by insulating layer 14 is an electrically conductive interconnect layer 15. Interconnect layer 15 typically is formed using a highly conductive material, such as aluminum or an alloy of aluminum, patterned to interconnect various components within active region 13 to other active components within active region 13 and to external circuitry (not shown), as desired. As is well known to those of ordinary skill in the semiconductor art, connections between conductive layer 15 and selected regions within active area 13 are provided by openings or "vias" 19 in the insulating layer 14 covering the active region 13.

During operation of the circuit shown in FIG. 1a, a signal applied between point A of the electrical interconnect layer 15 and the lead frame 11, or other common conductor, will be propagated to point B of the electrical interconnect layer 15. At high frequencies, the signal propagates from point A to B as an electromagnetic wave having traveling electric and magnetic field components in the regions between layer 15 and the lead frame 11. The electromagnetic field components and their associated voltages and currents are distributed in these regions in such a manner as to satisfy well-known Maxwell relationships relating to "skin effect". That is, at high frequencies, high frequency currents are found in the portions of the substrate 12 closest to conductor 15. The active region 13 may also play a role, but it is rarely continuous directly below 15 and may be disregarded in a first approximation.

Because substrate 12 usually has far higher resistivity than do metals such as copper, skin effect becomes significant at much lower frequencies. For example, skin depth in centimeters is given by $\delta = 5{,}033\sqrt{\rho/\mu f}$ (Terman, Radio Engineer's Handbook, 1st Edition, p. 34, McGraw-Hill, 1943) where $\rho$ is resistivity in ohm-cm, $\mu$ is relative permeability and f is frequency in hertz. For aluminum at 10 Ghz, $\delta$ is approximately $8 \times 10^{-5}$ cm. For silicon having a resistivity of 0.001 ohm-cm, $\delta = 1.59 \times 10^{-3}$ cm. Thus, if conductor 15 was a layer of aluminum $1.59 \times 10^{-3}$ cm wide and $10^{-4}$ cm thick, its series resistance $R_S$ would be about 19.6 ohms per cm. A corresponding layer of silicon, such as substrate 12, would have a series resistance of about 390 ohms per cm, a ratio of nearly 20:1.

On the other hand, if conductor 15 were $10^{-4}$ cm wide and $10^{-4}$ cm thick, the ratio of the series resistance of silicon to the series resistance of the conductor 15 would be reduced, but the high frequency series resistance $R_S$ of the silicon, which is effective in attenuating waves with rise times of 15 picoseconds, would be around 5 to 7 times higher than that of the aluminum. For example, for 50 picosecond rise times, the ratio would probably be in the range 3 to 4.5. Taking 6 as the ratio for a 15 picosecond (10 Ghz) rise time, the substrate series resistance $R_S$ would be around 1800 ohms per centimeter versus 300 ohms per centimeter for an aluminum conductor $10^{-4}$ cm $\times 10^{-4}$ cm in area. Using these assumptions, the combined series resistance $R_S$ of the conductor 15 and the substrate would be approximately 2100 ohms/cm.

With the characteristic impedance $Z_O$ of a transmission line composed of the conductor 15 and the substrate 12 in the range of 50–100 ohms, e.g., about 70 ohms, attenuation of a 10 Ghz signal is given approximately by the equation $e^{-(R_S X/2 Z_O)}$ where $R_S$ is the combined series resistance per unit length (i.e., 2100 ohms per cm in this case) and X is the line length. For a 20% attenuation, $X = 1.49 \times 10^{-2}$ cm. For a 50% attenuation, $X = 4.6 \times 10^{-2}$ cm. These lengths are short compared to the lengths of some conductors on complex logic chips. A reduction of $R_S$ is therefore essential for circuits operating at extremely high frequencies.

SUMMARY

In view of the foregoing, a principal object of the present invention is an integrated circuit having a relatively low combined series resistance to high frequency signals.

In accordance with this invention, there is provided an integrated circuit device including a ground plane of high conductivity to high frequency signals. The ground plane is physically and electrically insulated from overlying electrical interconnects by a thin dielectric layer having a low dielectric constant. The use of the ground plane in accordance with the teachings of this invention results in decreased dispersion of signals within the integrated circuit and thus decreased attenuation and delay of signals, as compared to prior art integrated circuit devices.

In a preferred embodiment of the invention, active areas are formed in a layer of a semiconductor substrate in a well known manner. Thereafter, a first dielectric layer is formed on the surface of the substrate and pattered to expose those active areas which are to be selectively electrically connected to an overlying first and second conductive layer. The first conductive layer is then formed in a well known manner. This layer serves as a ground plane, and also provides desired electrical interconnection to the chip ground. The first conductive layer, or ground plane, is then patterned to allow electrical connections to be formed through (although insulated from) the ground plane between selected active areas in the substrate and a to-be-formed second conductive layer. The second conductive layer will overlay and be insulated from the first layer and provides a plurality of electrical interconnect paths for electrical signals within the integrated circuit. Thereafter, a second dielectric layer is formed on the first conductive layer and vias are formed through said first and second dielectric layers to expose those selected active areas within the semiconductor substrate which are to be connected to the to-be-formed second conductive layer. The second conductive layer is then formed on the entire surface of the second dielectric layer. The second conductive layer is connected to selected active regions within the substrate through vias formed in the first and second dielectric layers. The second conductive layer is then patterned to provide the desired interconnection pattern between certain of the active areas in the substrate and contact pads located around the periphery of the device for electrical connection to external components.

The electromagnetic signals between the second electrical interconnect conductive layer and the ground plane are established only through said second dielectric layer, thereby minimizing undesired coupling between the electromagnetic signals and the substrate. Furthermore, because the electromagnetic signals are carried only by the second interconnect conductive layer, the second dielectric layer, and the ground plane, power loss and the resulting attenuation of the electromagnetic signals within a circuit constructed in accordance with this invention are substantially reduced as compared to prior art structures.

In another embodiment of the invention, the functions of the first and second conductive layers described above are reversed such that the first conductive layer provides a plurality of electrical interconnect paths, and the second conductive layer, which is above the first layer, serves as the ground plane. In this embodiment, the first dielectric layer includes vias allowing electrical connection between the first interconnect conductive layer and selected active areas in the semiconductor substrate. The first dielectric layer, the second dielectric layer and the first conductive layer also include vias allowing electrical connection between the upper ground plane and selected areas of the semiconductor substrate.

In still another embodiment of the invention, there is provided a pair of ground planes between which is sandwiched one or more electrical signal interconnect layers as described above. Between each conductive layer and an underlying substrate, there is provided a dielectric layer. Suitable holes or vias, as described above, are provided for electrically connecting the conductive layers, including the ground planes to selected portions of the underlying substrate.

DETAILED DESCRIPTION

Figure 1A:
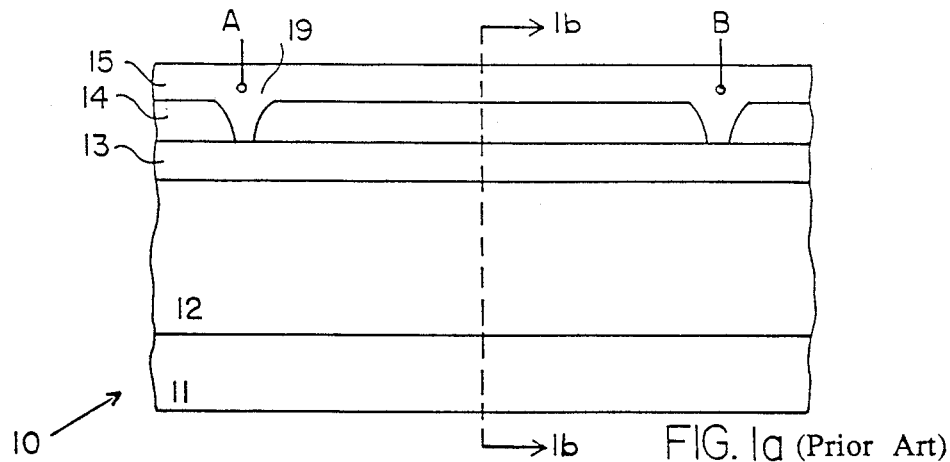
FIGS. 1a and 1b are cross-sectional views of a prior art integrated circuit device and depict the problems of signal attenuation and dispersion in such prior art devices.
Figure 1B:
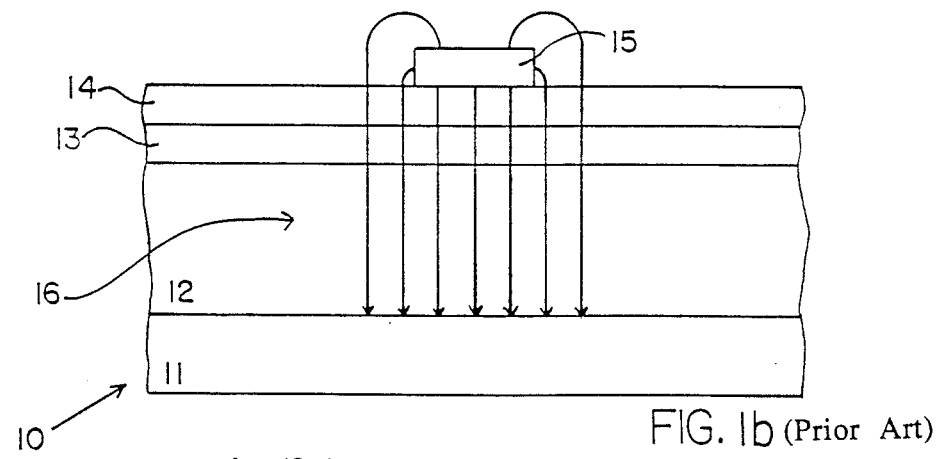
Figure 2A:
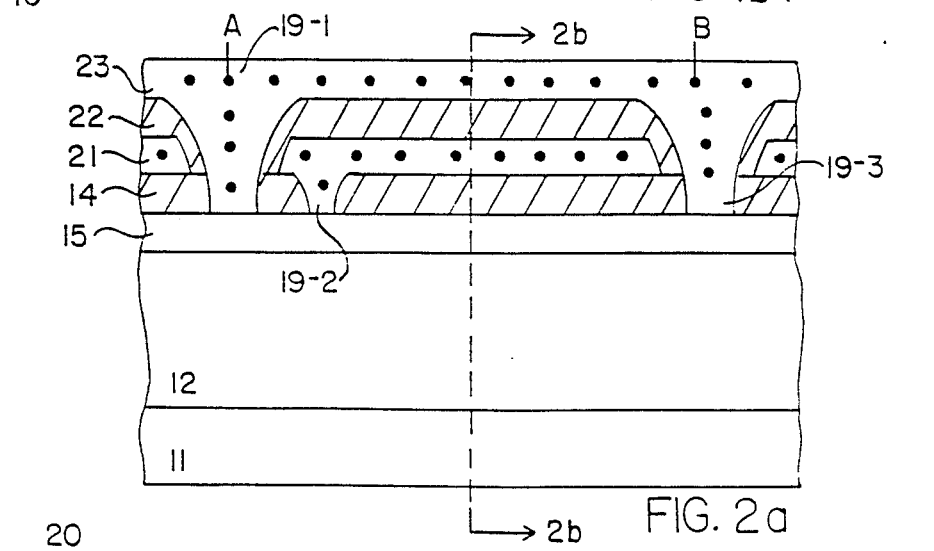
FIGS. 2a and 2b are cross-sectional views of a preferred embodiment of a semiconductor device constructed in accordance with this invention.
Figure 2B:
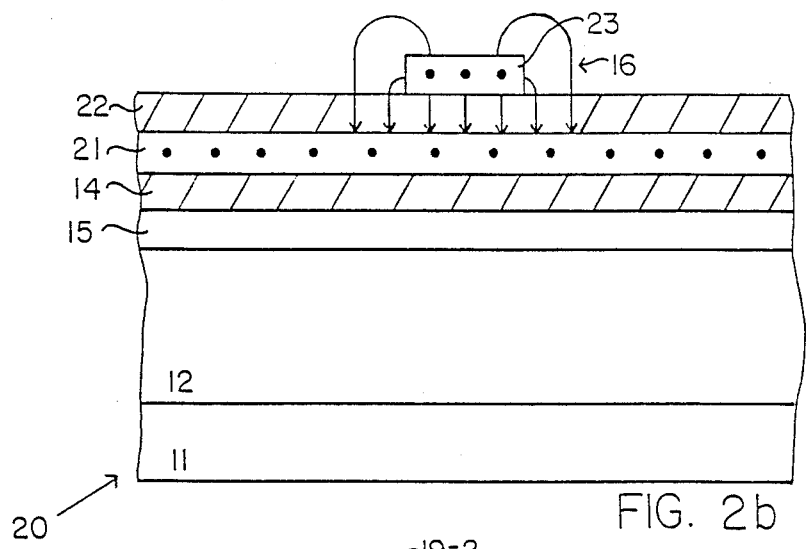

A first embodiment of a semiconductor device constructed in accordance with the teachings of this invention is depicted in the cross-sectional views of FIGS. 2a and 2b. As shown in FIG. 2a, a semiconductor substrate 12 is mounted on a conductive lead frame 11. Semiconductor substrate 12 includes an active layer 13, which contains one or more active semiconductor devices. Formed on active layer 13 is dielectric layer 14 including vias 19-1, 19-2 and 19-3. Formed on dielectric layer 14 is electrically conductive layer 21, which serves as the ground plane of the device. Ground plane 21 is substantially continuous over the surface of substrate 12 except, of course, for those regions where vias 19-1 and 19-3 are required to allow connection between selected portions of active area 13 and a signal interconnect layer 23. Formed on ground plane 21 is dielectric layer 22, including vias 19-1 and 19-3. A second conductive layer of electrical interconnects 23 is formed on dielectric layer 22 and, as previously described, interconnect layer 23 is connected through vias 19-1 and 19-3 to selected portions of active area 13. Not shown are connections of layer 21 to chip ground and to those portions of particular devices which are designed to be at ground potential.

The cross-sectional view of FIG. 2b is taken along the line 2b—2b of FIG. 2a. As shown in FIG. 2b, the electric field 16 associated with the propagation of a signal through electrical interconnect 23 extends from electrical interconnect 23, through dielectric layer 22, to electrical ground plane 21, rather than to substrate 12, thereby minimizing the dispersion of the signal carried by electrical interconnect 23 in the manner quantified previously in this specification.

The fabrication of the embodiment of this invention depicted in FIGS. 2a and 2b will now be described in conjunction with FIGS. 3a through 3d.

Figure 3A:
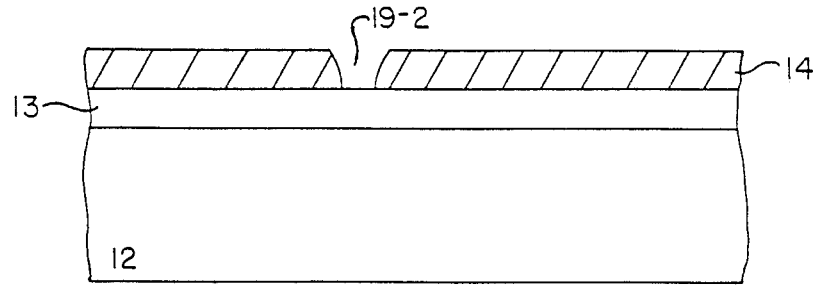
FIGS. 3a through 3d are cross-sectional views depicting the fabrication of the structure of FIGS. 2a and 2b.

As shown in FIG. 3a, a silicon substrate 12 is utilized, and active devices are formed within active region 13 in any one of a number of manners, all of which are well known to those of ordinary skill in the art and all of which may be used equally effectively in accordance with the teachings of this invention. Formed on the surface of active region 13 is a dielectric layer 14, for example, silicon dioxide formed to a thickness of approximately 10,000 Å by oxidation in wet oxygen for approximately 6–8 hours at approximately 900° C. Portions of dielectric layer 14 are defined, for example, by well known photolithographic techniques and etched, for example, with buffered HF to form opening or via 19-2.

Figure 3B:
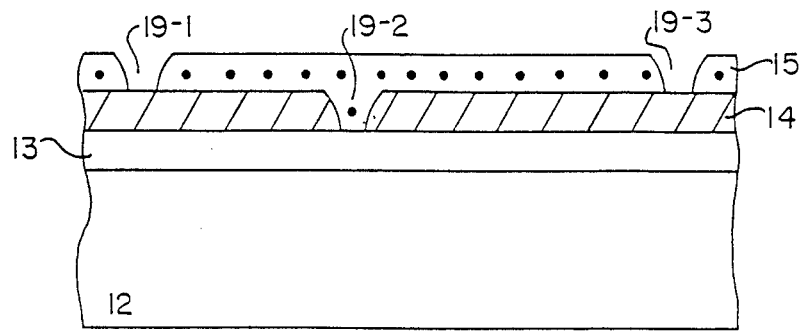

As shown in FIG. 3b, a layer of electrically conductive material 15 serving as the ground plane is then formed on dielectric layer 14, with electrical interconnect layer 15 extending through via 19-2, thus providing electrical interconnection to the region of active layer 13 exposed by via 19-2. Electrical ground plane 15 typically is formed of aluminum or an alloy thereof formed, for example, by well known sputtering or evaporation techniques to a thickness of approximately 8000 Å. Selected portions of ground plane 15 are then defined, for example, using well known photolithographic techniques and etched to form vias 19-1 and 19-3. This etching is performed, for example, utilizing a solution consisting of acidic, nitric and phosphoric acids.

Figure 3C:
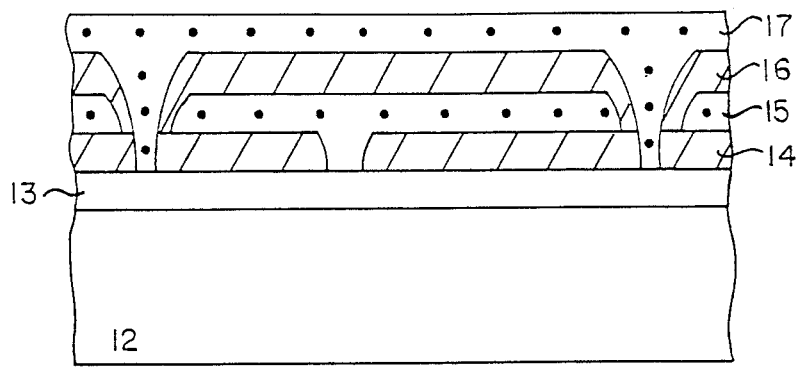

As shown in FIG. 3c, a second dielectric layer 16 is then formed, for example, by low pressure chemical vapor deposition well known to those of ordinary skill in the semiconductor art and described, for example, by Rosler in an article in Solid State Technology entitled "Low Pressure CVD Production Processes for Poly, Nitride, and Oxide", April 1977, pages 63–70. Dielectric layer 16 is, for example, silicon dioxide formed to a thickness of approximately 10,000 Å. Of importance, dielectric layer 16 also is formed on the surface of ground plane 15 located within vias 19-1 and 19-3, thus preventing electrical connection between the to-be-formed electrical interconnect layer 17 and ground plane 15. Vias 19-1 and 19-2 are then defined, for example, using well known photolithographic techniques, and the portions of dielectric layers 14 and 16 so defined are etched, for example with buffered HF, thereby forming vias 19-1 and 19-2, exposing portions of active layer 13 which are to be connected to electrical interconnect layer 17.

Figure 3D:
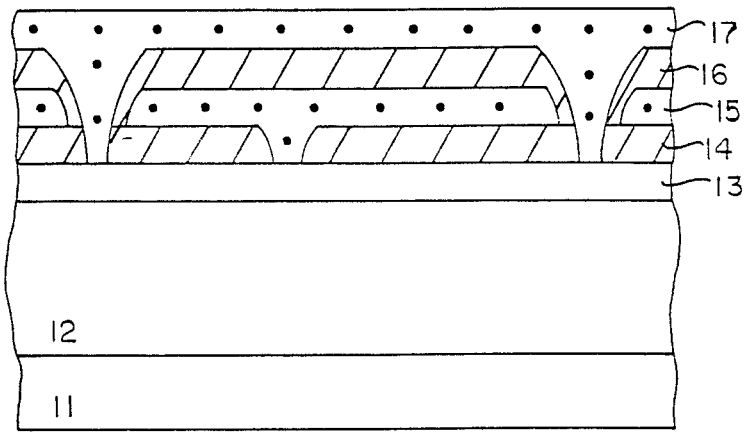

Electrical interconnect layer 17 is then formed in a well known manner, for example, by evaporating or sputtering aluminum or an alloy thereof in a well known manner to a thickness of approximately 12,000 Å. The completed device is shown in FIG. 3d attached to conductive lead frame 11.

Figure 4:
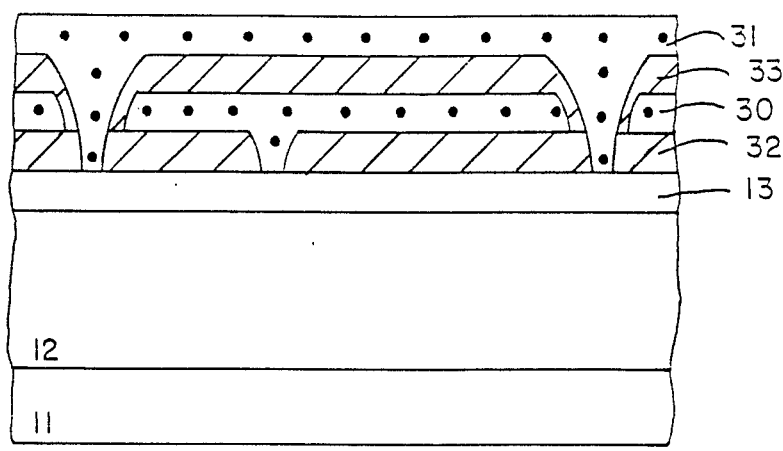
FIGS. 4 and 5 are cross-sectional views of two other embodiments of a semiconductor device constructed in accordance with this invention.

Referring to FIG. 4, in an alternative embodiment of this invention, the structure and function of the first and second conductive layers are reversed. In this embodiment, there is provided a first conductive layer 30 for providing a plurality of electrical interconnect paths, and a second conductive layer 31 above the first layer which serves as the ground plane. A first dielectric layer 32, including vias for allowing electrical connection between the first conductive layer 30 and selected exposed portions of the semiconductor layer 13 is provided between layer 30 and the layer 13. A second dielectric layer including vias allowing electrical connection between the ground plane 31 and selected portions of the semiconductor layer 13 is provided between layer 31 and layer 30.

Figure 5:
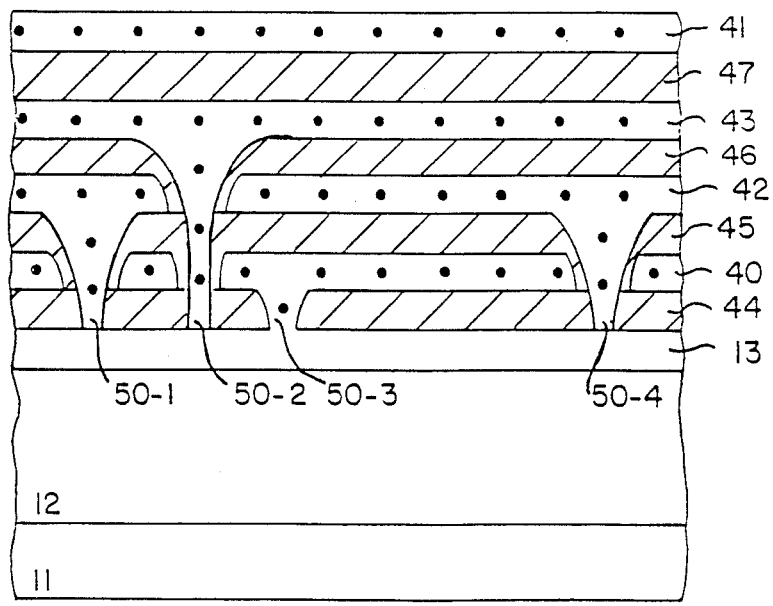

Referring to FIG. 5, there is provided in still another embodiment of the present invention a pair of electrically conductive ground planes 40 and 41 between which is sandwiched at least one interconnecting layer. FIG. 5 shows a pair of patterned electrical interconnecting layers 42 and 43, though more or less than that number may be used. Electrically insulating each of the layers 40-43 and an underlying semiconductive layer 13 is a plurality of dielectric layers 44, 45, 46 and 47. Holes, or vias, 50-1, 50-2, 50-3, 50-4 and other vias (not shown) are provided, as required, through each of the underlying layers, as described above with respect to FIGS. 2 and 3, for electrically connecting the conductive layers to selected regions of the layer 13. Of importance, the conductive material in each via is electrically insulated from the remaining layers of electrical interconnects, as shown.

In each of the embodiments of FIGS. 2 through 5, the effective cross-sectional area of the conductive interconnecting layers and the intermediate dielectric layers above the lowest ground plane is made large for reducing the loss of very high frequency signals. For example, a lead in an interconnecting layer having a cross-sectional area of 5 microns×5 microns overlying a 5 micron thick dielectric layer will have a resistivity of approximately 15 ohms/cm at very high frequencies within the range of 1–5 ghz, which is significantly reduced as compared to structures of the prior art.

Thus, in accordance with the teachings of this invention, the dispersion of signals propagated on electrical interconnects is drastically reduced, thereby greatly reducing the signal power loss and the resulting signal attenuation, as compared to prior art structures.

The specific embodiments presented in the specification are intended to serve by way of example only and are not to be construed as limitations on the scope of my invention. Many other embodiments of my invention will become apparent to those of ordinary skill in the art in light of the teachings of this specification.

I claim:

1. A semiconductor structure comprising:
   a layer of semiconductor material having active regions formed therein;
   a first conductive interconnecting signal layer;
   a first conductive ground plane layer disposed between said first signal layer and said semiconductor material;
   a second conductive ground plane layer;
   a second conductive interconnecting signal layer disposed between said first signal layer and said second conductive ground plane layer,
   said first and second conductive ground planes being sufficiently continuous and sufficiently conductive to adequately reduce coupling between said conductive signal path and said semiconductor material, said first and second conductive ground planes having a plurality of connections with one or more of said active devices, wherein said first and second conductive ground planes and said at least one conductive signal path serve as a transmission line of predetermined characteristic impedance; and
   a plurality of dielectric layers for electrically insulating said first and second conductive ground plane layers, said first and second interconnecting signal layers, and said semiconductor material from each other, each of said layers being provided with a means for permitting an electrical connection from any of said conductive layers located above said one of said layers to selected regions of said semiconductor material.

2. A semiconductor structure comprising:
   a layer of semiconductor material having active devices formed therein;
   a first dielectric layer formed on said layer of semiconductor material; and
   a transmission line capable of transmitting high frequency signals formed on said first dielectric layer, said transmission line comprising:
   a conductive ground plane means formed on said first dielectric layer, a second dielectric layer formed on said conductive ground plane means, and a plurality of first conductive signal paths formed on said second dielectric layer;

said plurality of conductive signal paths being capable of transmitting said high frequency signals and being connected to a plurality of said active devices within said semiconductor material, and said conductive ground plane means being sufficiently continuous and sufficiently conductive to adequately reduce dispersion of said high frequency signals by said semiconductor material, said conductive ground plane means serving simultaneously as a plurality of second signal paths between said active devices in said semiconductor material and as an electromagnetic shield between said first signal paths and said semiconductor material, each of said second signal paths being associated with a corresponding one of said first signal paths, and said conductive ground plane means having a plurality of connections with a plurality of said active devices.

3. A semiconductor structure comprising:

a layer of semiconductor material having active regions formed therein;

at least one transmission line capable of transmitting high frequency signals formed above said layer of semiconductor material, said at least one transmission line comprising:

a conductive interconnecting signal layer capable of receiving said high frequency signals, said conductive interconnecting signal layer contacting said active regions in said semiconductor material, a conductive ground plane layer means disposed between said signal layer and said layer of semiconductor material, said conductive ground plane layer means being sufficiently continuous and sufficiently conductive to adequately reduce dispersion of said high frequency signals by said semiconductor material, said conductive ground plane layer means having a plurality of connections with a plurality of said active regions and serving simultaneously as an electromagnetic shield between said conductive interconnecting signal layer and said semiconductor material and as a plurality of second signal paths between said active regions; and a plurality of dielectric layers for electrically insulating said conductive ground plane means, said interconnecting signal layer and said semiconductor material from each other, each of said layers being provided with means for permitting an electrical connection from any of said conductive layers located above said one of said layers to selected regions of said semiconductor material.

4. A semiconductor structure comprising:

a layer of semiconductor material having active devices formed therein;

a first dielectric layer formed on said layer of semiconductor material;

a transmission line capable of transmitting high frequency signals, said transmission line comprising:

a conductive ground plane means formed on said first dielectric layer, a second dielectric layer formed on said conductive ground plane means, and a plurality of conductive signal paths formed on said second dielectric layer, being connected to active devices in said semiconductor material;

said conductive ground plane means being sufficiently continuous and sufficiently conductive to adequately reduce dispersion of said high frequency signals by said semiconductor material, said conductive ground plane means providing a second signal path between a plurality of said active devices, and wherein said conductive ground plane means includes holes for electrically connecting said conductive signal path to said layer of semiconductor material and not to said ground plane means.

5. Structure as in claim 2 wherein said first dielectric layer includes at least one ground plane via for exposing a portion of said layer of semiconductor material and said conductive ground plane means provides electrical connection to that portion of said layer of semiconductor material which is exposed by said ground plane via.

6. Structure as in claim 2 wherein said first and second dielectric layer include at least one signal path via for exposing a portion of said layer of semiconductor material and said conductive signal path provides electrical connection to that portion of said layer of semiconductor material which is exposed by said signal path via.

7. A structure as in claim 1 wherein said first and said second dielectric layers comprise a material selected from the group of material consisting of silicon dioxide and silicon nitride.

8. A structure as in claim 1 wherein said first conductive layer is formed from a material selected from the group of materials consisting of aluminum and alloys of aluminum.

9. A structure as in claim 1 wherein said second conductive layer is formed from a material selected from the group of materials consisting of aluminum, alloys of aluminum, and polycrystalline silicon.

* * * * *